United States Patent
Wada et al.

(10) Patent No.: US 7,875,976 B2
(45) Date of Patent: Jan. 25, 2011

(54) SEMICONDUCTOR DEVICE INCLUDING A SILICIDE LAYER AND A DIELECTRIC LAYER

(75) Inventors: Makoto Wada, Kanagawa-ken (JP); Takamasa Usui, Tokyo (JP); Kazuya Ohuchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 465 days.

(21) Appl. No.: 11/868,011

(22) Filed: Oct. 5, 2007

(65) Prior Publication Data

US 2008/0088021 A1 Apr. 17, 2008

(30) Foreign Application Priority Data

Oct. 5, 2006 (JP) .............................. 2006-273948

(51) Int. Cl.
*H01L 23/52* (2006.01)
(52) U.S. Cl. .................. 257/751; 257/757; 257/767; 257/E23.157; 257/E23.16
(58) Field of Classification Search ................. 257/751, 257/753, 754, 757, 767, E23.142, E23.145, 257/E23.155, E23.157, E23.16
See application file for complete search history.

(56) References Cited

U.S. PATENT DOCUMENTS

| 6,064,118 | A | 5/2000 | Sasaki |
| 6,624,066 | B2 | 9/2003 | Lu et al. |
| 7,169,698 | B2 | 1/2007 | Gambino et al. |
| 7,304,384 | B2 | 12/2007 | Koike et al. |
| 2007/0004049 | A1 | 1/2007 | Nasu et al. |
| 2007/0012973 | A1 | 1/2007 | Nasu et al. |
| 2007/0020931 | A1 | 1/2007 | Koura et al. |
| 2007/0170483 | A1 | 7/2007 | Hayashi et al. |
| 2007/0210448 | A1* | 9/2007 | Wong et al. ................. 257/734 |

FOREIGN PATENT DOCUMENTS

| JP | 8-17920 | 1/1996 |
| JP | 10-294316 | 11/1998 |
| JP | 2000-208621 | 7/2000 |
| JP | 2006-80234 | 3/2006 |

OTHER PUBLICATIONS

J. Koike, et al., "Cu Alloy Metallization for Self-Forming Barrier Process", IITC Proceedings, Jun. 5, 2006, pp. 161-163.
J. Koike, et al., "Self-Forming Diffusion Barrier Layer in Cu-Mn Alloy Metallization", Applied Physics Letters 87, 041911, Jul. 22, 2005, pp. 1-3.

* cited by examiner

*Primary Examiner*—Matthew E Warren
(74) *Attorney, Agent, or Firm*—Oblon, Spivak, McClelland, Maier & Neustadt, L.L.P.

(57) ABSTRACT

In one aspect of the present invention, a semiconductor device may include a semiconductor substrate, a silicide layer provided on the semiconductor substrate, a dielectric layer provided on the semiconductor substrate, a contact layer provided on the silicide layer, a metal layer provided in the dielectric layer and electrically connected to the silicide layer via the contact layer, a diffusion barrier layer provided between the dielectric layer and the metal layer, wherein the contact layer includes a first metal element provided in the metal layer, a second metal element provided in the diffusion barrier layer and at least one of a third metal provided in the silicide layer and Si element.

24 Claims, 4 Drawing Sheets

SEMICONDUCTOR DEVICE INCLUDING A SILICIDE LAYER AND A DIELECTRIC LAYER

CROSS REFERENCE TO RELATED APPLICATION

This application is based upon and claims the benefit of priority from Japanese Patent Application No. 2006-273948, filed on Oct. 5, 2006, the entire contents of which are incorporated herein by reference.

BACKGROUND

In a conventional semiconductor device, a barrier metal such as TiN on the contact hole provided in a $SiO_2$ on the semiconductor substrate.

SUMMARY

Aspects of the invention relate to an improved semiconductor device.

In one aspect of the present invention, a semiconductor device may include a semiconductor substrate, a silicide layer provided on the semiconductor substrate, a dielectric layer provided on the semiconductor substrate, a contact layer provided on the silicide layer, a metal layer provided in the dielectric layer and electrically connected to the silicide layer via the contact layer, a diffusion barrier layer provided between the dielectric layer and the metal layer, wherein the contact layer includes a first metal element provided in the metal layer, a second metal element provided in the diffusion barrier layer and at least one of a third metal provided in the silicide layer and Si element.

In another aspect of the invention, a method of manufacturing semiconductor device may include providing a silicide layer on a semiconductor substrate, providing a dielectric layer on the silicide layer, providing a hole in the dielectric layer with the silicide layer being exposed from the hole, providing a precursor film on a bottom surface and an inner surface of the hole, providing a metal layer in the hole, providing a contact layer on the silicide layer and diffusion barrier layer on the inner surface of the hole, by annealing the silicide layer, dielectric layer, the precursor film and the metal layer.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1A:
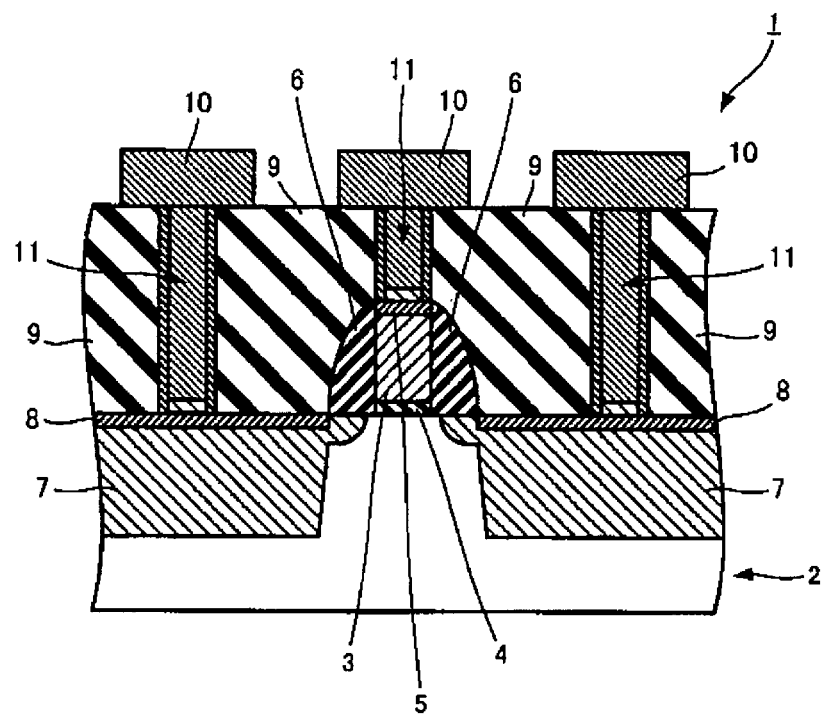
FIGS. 1A and 1B are cross sectional views of a semiconductor device in accordance with a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

A first embodiment of the present invention will be explained hereinafter with reference to FIGS. 1A-2F.

Figure 1B:
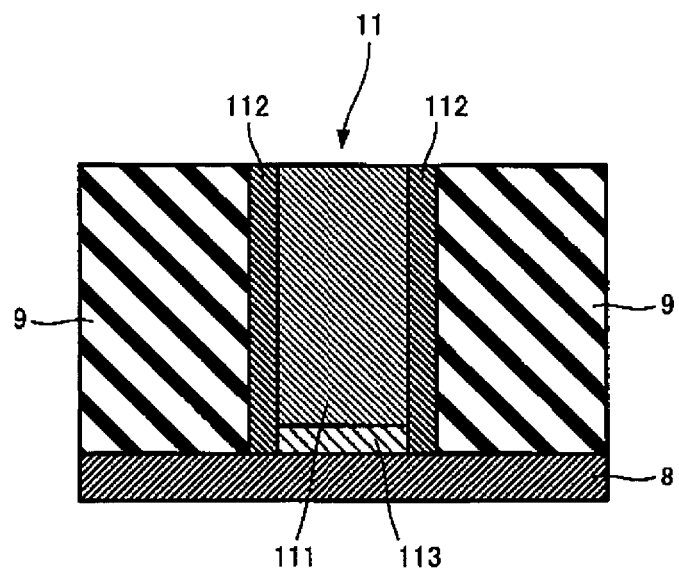

FIG. 1A is cross sectional view of a semiconductor device 1 in accordance with a first embodiment. FIG. 1B is an enlarged cross sectional view of the semiconductor device 1 showing a contact structure 11.

As shown in FIG. 1A, in the semiconductor device 1, a gate electrode 3, which is provided on a semiconductor substrate 2 via a gate dielectric layer 4, a gate silicide layer 5, which is provided on the gate electrode 3, a gate sidewall 6, which is provided on a side surface of the gate electrode 3, a source/drain region 7, which is provided in the surface of the semiconductor substrate 2, a source/drain silicide layer 8, which is provided on the surface of the source/drain region 7, a dielectric layer 9, which is provided on the source/drain silicide layer 8, gate sidewall 6 and gate silicide layer 5, and a contact structure 11, which is provided in the dielectric layer 9, are provided. A wiring layer 10 is provided on the contact structure 11 and is electrically connected to the source/drain silicide layer 8 and gate silicide 5, respectively.

In FIG. 1A, the contact structure 11 on the gate silicide 5 and the contact structure 11 on the source/drain silicide layer 8 are in one cross sectional view. However, the layout may be not limited to the layout as shown in FIG. 1.

The semiconductor substrate 2 may be silicon substrate.

The gate dielectric layer 4 may be, for example, SiON, or a high dielectric constant material (for example Hf based material such as HfSiON, HfSiO or HfO, Zr based material such as ZrSiON, ZrSiO or ZrO, or Y based material such as $Y_2O_3$).

The gate electrode 3 may be polycrystalline silicon, polycrystalline silicon germanium or the like. On the gate electrode 3, the gate silicide layer 5, which is made of a compound of Ni and Si, is provided.

The gate sidewall 6 may be a single layer structure, which is made of SiN, $SiO_2$ or the like, a two-layer structure, which has SiN and $SiO_2$, or more than three-layer structure.

The source/drain region 7 may be formed by implanting p type impurity ion, such as B, BF2, In or the like, into semiconductor substrate 2, when the transistor is p type transistor. The source/drain region 7 may be formed by implanting n type impurity ion, such as As, P, or the like, into semiconductor substrate 2, when the transistor is n type transistor.

The source/drain silicide layer 8 may be a compound of a Ni and Si, and provided on the source/drain region 7 and on the surface of the semiconductor substrate 2.

The dielectric layer 9 may be an oxide including Si, such as $SiO_2$, BPSG (Boron Phosphorus Silicate Glass), SiON, SiOC, polydimethylsiloxane, hydrogen silsesquioxane or the like.

The wiring 10 may be a metal, such as Cu, Al, Au, Ag, W or the like.

As shown in FIG. 1B, the contact structure 11 has a metal plug 111, a diffusion barrier layer 112, which is configured to block the metal in the metal plug 111 to diffuse outward, and a contact layer 113, which is provided between the source/drain silicide layer 8 and the metal plug 111.

The metal plug 111 may be Cu, the diffusion barrier layer 112 may be MnSiO compound, and the contact layer 113 may be CuMnNi alloy.

In FIG. 1B, the contact structure 11, which is provided on the source/drain silicide layer 8, is disclosed. However, the contact structure 11 on the gate silicide 5 may be the same structure as shown in FIG. 1B.

Next, a manufacturing process of the semiconductor device 1 will be explained hereinafter with reference to FIGS. 2A-2F.

FIGS. 2A-2F show the contact structure 11 on the source/drain silicide layer 8. However, the contact structure 11 on the gate silicide 5 may be manufactured by the same process as shown in FIGS. 2A-2F.

Figure 2A:
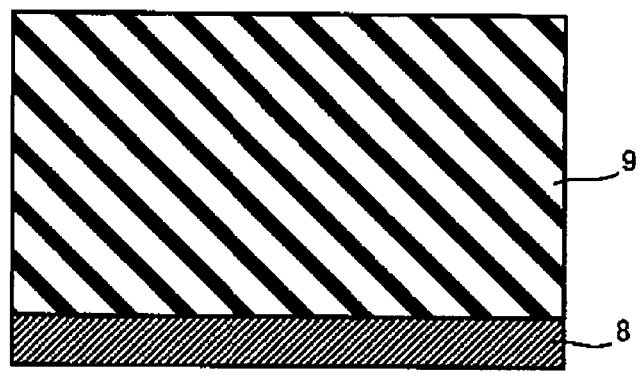
FIGS. 2A-2F are cross sectional views showing a manufacturing process of a semiconductor device.

As shown in FIG. 2A, a dielectric layer 9 is formed on the source/drain silicide layer 8.

Figure 2B:
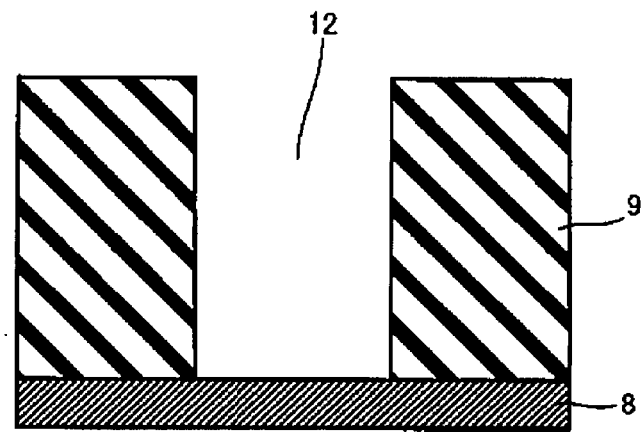

As shown in FIG. 2B, a contact hole 12 is formed in the dielectric layer 9 such that the source/drain silicide layer 8 is exposed from the contact hole 12 by etching.

Figure 2C:
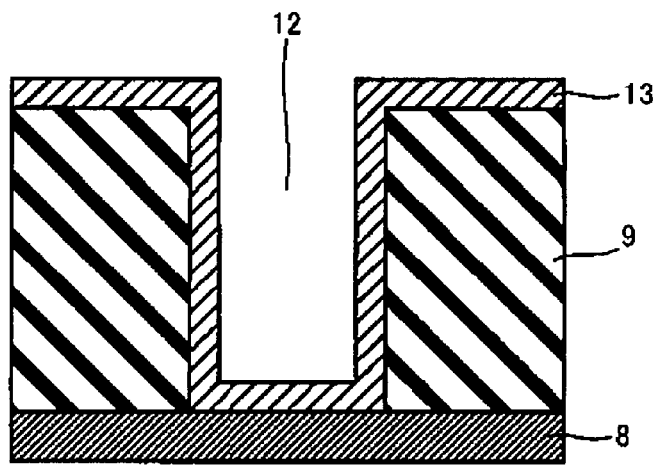

As shown in FIG. 2C, a precursor film 13 is formed on a top surface and an inner surface of the dielectric layer 9 and an exposed surface of the source/drain silicide layer 8. The precursor film 13 may be formed by sputtering with using CuMn alloy target. The Mn concentration of the CuMn alloy target may be 0.05-10 atom percent (at %).

Figure 2D:
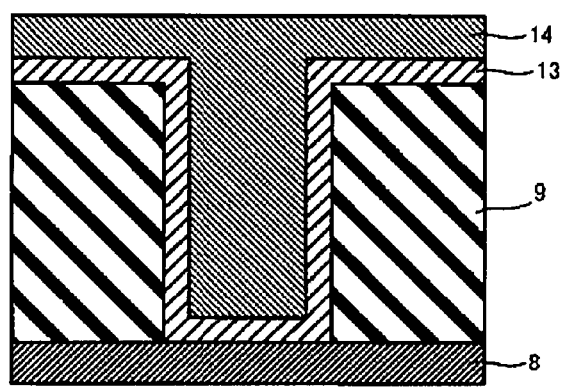

As shown in FIG. 2D, a metal 14, which is, for example, made of Cu, is formed on the precursor film 13 by electrolytic plating with the precursor film 13 as a seed layer.

Figure 2E:
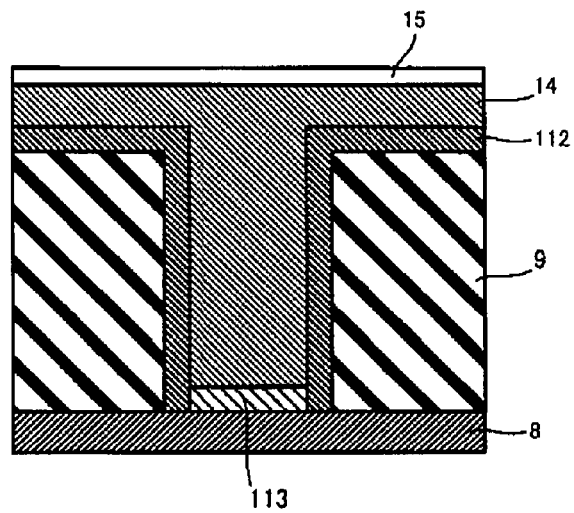

As shown in FIG. 2E, a heat operation (annealing), which is more than 250 Centigrade, is provided.

So the CuMn alloy in the precursor film 13 and $SiO_2$ in the dielectric layer 9 are reacted, and the diffusion barrier layer 112, which is MnSiO compound having 2-4 nm in thickness, is formed where the precursor film 13 is in contact with the dielectric layer 9.

Furthermore, the CuMn alloy in the precursor film 13 and the NiSi in the source/drain silicide layer 8 are reacted, and the contact layer 113, which is CuMnNi alloy having some nm in thickness, is formed where the precursor film 13 is in contact with the source/drain silicide layer 8.

A residual Mn, which is not participated to the formation of the diffusion barrier layer 112 and the contact layer 113, moves to diffuse in the metal 14 toward the top surface of the metal 14, and is precipitated as a non-reacted metal oxidation layer 15 which is a reaction product of Mn in precursor film 13.

Thus the amount of Mn in the metal 14 is small, since the Mn is moved to outside of the contact hole 12. So the electrical resistivity of the plug 111 may be not increased by Mn. If the Mn is dissolved in the plug 111, the amount of the solid solution is small by predicting with the thermal dynamics.

The MnSiO compound in the diffusion barrier layer 112 is a stable phase in the aspect of the thermal dynamics. So Once the MnSiO is formed, the diffusion barrier layer 112 has a good diffusion barrier characteristic and a stable film thickness, regardless of the annealing temperature and annealing time.

The diffusion barrier layer 112 may be Mn oxide layer, which does not contain Si, depending on a formation condition.

The contact layer 113, which is the CuMnNi alloy, is formed by self-forming. So, the contact layer 113 has a good adhesiveness to the plug 111 and the source/drain silicide layer 8, and the defects, such as voids or the like, is hardly generated. Furthermore, the contact layer 113 has low electrical resistivity, since the amount of the O atom and N atom is low. Although the CuMnNi alloy is in a stable phase depending on a concentration ratio of Cu, Mn and Ni, reaction temperature, and reaction time, the CuMnNi alloy has a low electrical resistivity. For example, the electrical resistivity of $Cu_{84}Mn_{12}Ni_4$ is 44 $\mu\Omega\cdot cm$, The electrical resistivity of $Cu_{73}Mn_{24}Ni_3$ is 48 $\mu\Omega\cdot cm$, and The electrical resistivity of $Cu_{18}Mn_{72}Ni_{10}$ is 175 $\mu\Omega\cdot cm$. So the CuMnNi alloy has a low electrical resistivity.

The CuMnNi alloy in the contact layer 113 has a good oxidation resistance, since the CuMnNi alloy is an intermetallic compound. Especially, in case a low-k dielectric layer, which includes water easily and an oxide is passed through easily, is used as the dielectric layer 9, the CuMnNi alloy is suitable for the contact layer 113, since the CuMnNi has a. The CuMnNi alloy, which has an oxidation resistance, is suitable for the contact structure 11.

Figure 2F:
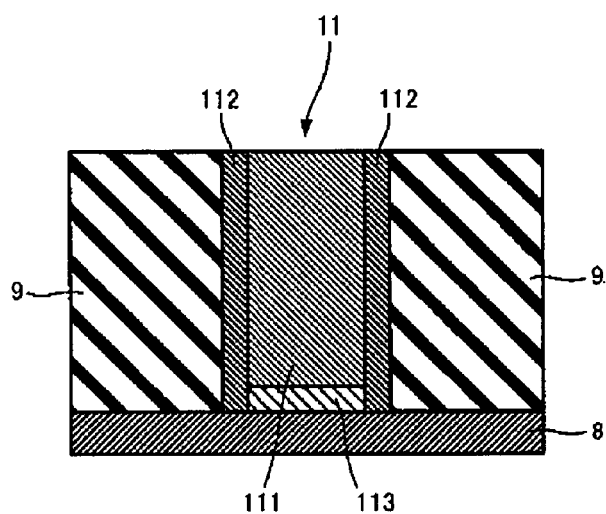

As shown in FIG. 2F, the non-reacted metal oxidation layer 15, metal 14, diffusion barrier layer 112 and dielectric layer 9 are removed by CMP (Chemical Mechanical Polishing) such that a top surface of the dielectric layer 9 is exposed. So, the plug 111 is created in the contact structure 11.

After that, a wiring (not shown in FIG. 2F) is formed on the contact structure 11.

In this embodiment, CuMn alloy is used as the precursor film 13. However, a lamination layer made of a Mn layer and a Cu layer may be used as the precursor film 13. In this case, the Mn layer is formed on the inner surface of the contact hole 12 by sputtering or CVD, and the Cu layer is formed on the Mn layer by sputtering. Later that, the metal 14 is formed by electrolytic plating.

In case the metal 14 is formed by CVD, a Mn layer may be used as a single layered precursor film 13, since a seed layer for electrolytic plating is not necessary.

In this embodiment, the contact layer 113 is made of a metal in the plug 111, a metal in the diffusion layer 112, and a metal or Si in the silicide layer 8.

In this embodiment, the contact layer 113, which has a good adhesiveness to the source/drain silicide layer 8 or gate silicide layer 5, is provided. So the semiconductor device 1 which has a good reliability and electric characteristic is obtained.

Second Embodiment

A second embodiment is explained with reference to FIGS. 3A-3C.

In this embodiment, a manufacturing process of the semiconductor device is different from that in the first embodiment.

A manufacturing process of the semiconductor device of the second embodiment will be explained hereinafter with reference to FIGS. 3A-3C.

Figure 3A:
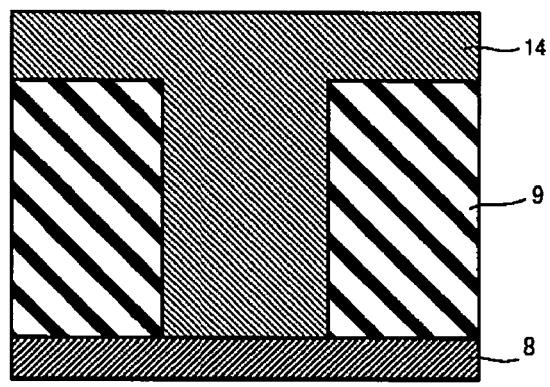
FIGS. 3A-3C are cross sectional views of a semiconductor device in accordance with a second embodiment.

As shown in FIG. 3A, a metal 14, which is made of CuMn alloy is provided in the dielectric layer 9. The metal 14 is in contact with the source/drain silicide layer 8.

Figure 3B:
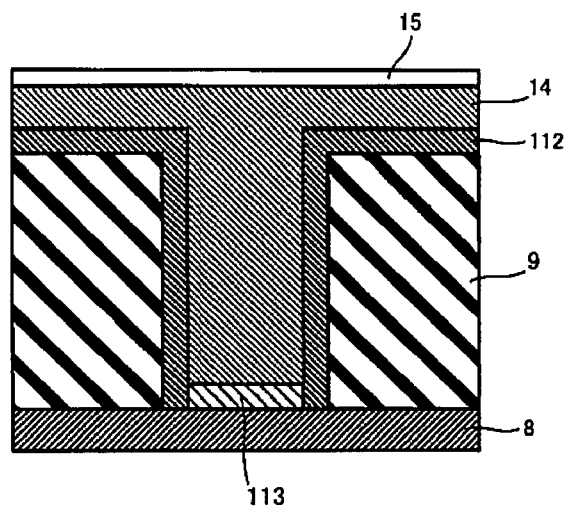

As shown in FIG. 3B, a heat operation (annealing) is provided. The CuMn alloy in the metal 14 and $SiO_2$ in the dielectric layer 9 are reacted, and the diffusion barrier layer 112, which is made of MnSiO compound, is formed on and near the boundary between the metal 14 and the dielectric layer 9. The CuMn alloy in the metal 14 and the NiSi in the source/drain silicide layer 8 are reacted, and the contact layer 113, which is made of CuMnNi, is formed on and near the boundary between the metal 14 and the source/drain silicide layer 8.

A residual Mn, which is not participated to the formation of the diffusion barrier layer 112 and the contact layer 113, moves to diffuse in the metal 14 toward the top surface of the metal 14, and is precipitated as a non-reacted metal oxidation layer 15 which is a reaction product of Mn in the metal 14. So, the metal 14 becomes substantially pure Cu, since most of the Mn is moved outside of the metal 14.

Figure 3C:
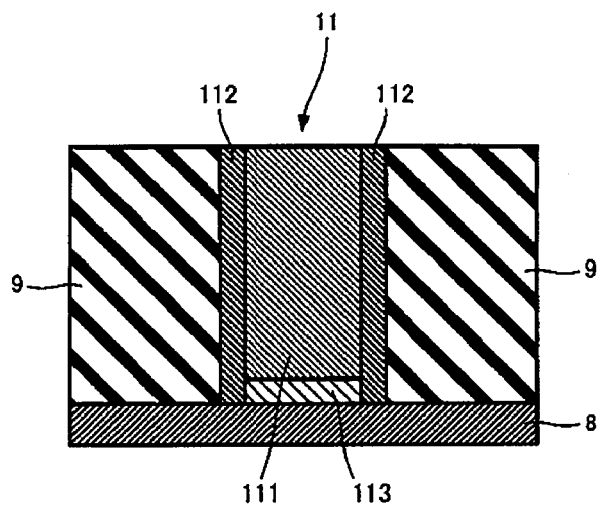

As shown in FIG. 3C, the non-reacted metal oxidation layer 15, metal 14, diffusion barrier layer 112 and dielectric layer 9 are removed by CMP such that a top surface of the dielectric layer 9 is exposed. So, the plug 111 is created in the contact structure 11.

In this embodiment, the diffusion barrier layer 112 and the contact layer 113 are formed by controlling the Mn concentration in the metal 14.

Third Embodiment

In this third embodiment, a material of the diffusion barrier layer 112 and contact layer 113 is different from those in the first embodiment.

The plug is made of Cu, the diffusion barrier layer 112 is made of ZnSiO compound, and the contact layer 113 is made of CuZnNi alloy.

In this embodiment, a CuZn alloy is used as the precursor film 13.

By providing anneal, the CuZn alloy in the precursor film 13 and $SiO_2$ in the dielectric layer 9 are reacted, and the diffusion barrier layer 112, which is made of ZnSiO compound, is formed on and near the boundary between the precursor film 13 and the dielectric layer 9.

By providing anneal, the CuZn alloy in the precursor film 13 and the NiSi in the source/drain silicide layer 8 are reacted, and the contact layer 113, which is made of CuZnNi, is formed on and near the boundary between the metal 14 and the source/drain silicide layer 8. The diffusion barrier layer 112 may be CuZn layer, which does not contain Si, depending on process condition or the dielectric layer 9.

For example, the electrical resistivity of $Cu_{60}Zn_{32}Ni_8$ is 72 $\mu\Omega\cdot cm$, the electrical resistivity of $Cu_{58}Zn_{24}Ni_{18}$ is 30.9 $\mu\Omega\cdot cm$, the electrical resistivity of $Cu_{44}Zn_{26}Ni_{30}$ is 47.6 $\mu\Omega\cdot cm$, and the electrical resistivity of $Cu_{61}Zn_{25}Ni_{14}$ is 33 $\mu\Omega\cdot cm$.

In this embodiment, CuZn alloy is used as the precursor film 13. However, a lamination layer made of a Zn layer and a Cu layer may be used as the precursor film 13. In this case, the Zn layer is formed on the inner surface of the contact hole 12 by sputtering or CVD, and the Cu layer is formed on the Zn layer by sputtering. Later that, the metal 14 is formed by electrolytic plating.

In case the metal 14 is formed by CVD, a Zn layer may be used as a single layered precursor film 13, since a seed layer for electrolytic plating is not necessary.

The CuZn alloy may be used as a metal 14 instead of providing the precursor film 13, as the similar process explained in the second embodiment. In such case, CuZn alloy in the metal 14 and the dielectric layer 9 and the source/drain silicide layer 8 (gate silicide layer 5) are reacted, and the diffusion barrier layer 112 and the contact layer 113 are formed.

Fourth Embodiment

In this fourth embodiment, a material of the diffusion barrier layer 112 and contact layer 113 is different from those in the first embodiment.

The plug 111 is made of Al, the diffusion barrier layer 112 is made of VSiO compound, the gate silicide layer 5 and the source/drain silicide layer 8 is made of TiSi and the contact layer 113 is made of AlVTi alloy.

In this embodiment, an AlV alloy is used as the precursor film 13.

By providing anneal, the AlV alloy in the precursor film 13 and $SiO_2$ in the dielectric layer 9 are reacted, and the diffusion barrier layer 112, which is made of VSiO compound, is formed on and near the boundary between the precursor film 13 and the dielectric layer 9.

By providing anneal, the AlV alloy in the precursor film 13 and the TiSi in the source/drain silicide layer 8 are reacted, and the contact layer 113, which is made of AlVTi, is formed on and near the boundary between the metal 14 and the source/drain silicide layer 8. The diffusion barrier layer 112 may be V (vanadium) oxide layer, which does not contain Si, depending on process condition or the dielectric layer 9.

For example, the electrical resistivity of $Al_6V_4Ti_{90}$ is 167.5 $\mu\Omega\cdot cm$.

In this embodiment, AlV alloy is used as the precursor film 13. However, a lamination layer made of a V layer and an Al layer may be used as the precursor film 13. In this case, the V layer is formed on the inner surface of the contact hole 12 by sputtering or CVD, and the Al layer is formed on the V layer by sputtering. Later that, the metal 14, which is made of Al, is formed by electrolytic plating.

In case the metal 14 is formed by CVD, a V layer may be used as a single layered precursor film 13, since a seed layer for electrolytic plating is not necessary.

The AlV alloy may be used as a metal 14 instead of providing the precursor film 13, as the similar process explained in the second embodiment. In such case, AlV alloy in the metal 14 and the dielectric layer 9 and the source/drain silicide layer 8 (gate silicide layer 5) are reacted, and the diffusion barrier layer 112 and the contact layer 113 are formed.

Fifth Embodiment

In this fourth embodiment, a material of the diffusion barrier layer 112 and contact layer 113 is different from those in the first embodiment.

The plug 111 is made of Al, the diffusion barrier layer 112 is made of MgSiO compound, the gate silicide layer 5 and the source/drain silicide layer 8 is made of a metal silicide, and the contact layer 113 is made of AlMgSi alloy.

In this embodiment, an AlMg alloy is used as the precursor film 13.

By providing anneal, the AlMg alloy in the precursor film 13 and $SiO_2$ in the dielectric layer 9 are reacted, and the diffusion barrier layer 112, which is made of MgSiO compound, is formed on and near the boundary between the precursor film 13 and the dielectric layer 9.

By providing anneal, the AlMg alloy in the precursor film 13 and the Si in the source/drain silicide layer 8 are reacted, and the contact layer 113, which is made of AlMgSi, is formed on and near the boundary between the metal 14 and the source/drain silicide layer 8. The diffusion barrier layer 112 may be Mg oxide layer, which does not contain Si, depending on process condition or the dielectric layer 9.

For example, the electrical resistivity of $Al_{99}Mg_{0.5}Si_{0.5}$ is 3.25 $\mu\Omega\cdot cm$, In this embodiment, AlMg alloy is used as the precursor film 13. However, a lamination layer made of a Mg layer and an Al layer may be used as the precursor film 13. In this case, the Mg layer is formed on the inner surface of the contact hole 12 by sputtering or CVD, and the Al layer is formed on the Mg layer by sputtering. Later that, the metal 14, which is made of Al, is formed by electrolytic plating.

In case the metal 14 is formed by CVD, a Mg layer may be used as a single layered precursor film 13, since a seed layer for electrolytic plating is not necessary.

The AlMg alloy may be used as a metal 14 instead of providing the precursor film 13, as the similar process explained in the second embodiment. In such case, AlMg alloy in the metal 14 and the dielectric layer 9 and the source/drain silicide layer 8 (gate silicide layer 5) are reacted, and the diffusion barrier layer 112 and the contact layer 113 are formed.

Embodiments of the invention have been described with reference to the examples. However, the invention is not limited thereto.

For example, in the embodiments, the silicide layers are provided on the gate and source/drain region. However, the silicide layer may be not provided on one of the gate and source/drain region.

At least one of the contact structures on the gate or the source/drain may be the contact structure, which is described above.

The material used in the plug 111, source/drain silicide layer 8, gate silicide layer 5, diffusion barrier layer 112 and contact layer 113 is not limited the materials shown in the embodiments.

For example, the contact layer includes a first metal element provided in the metal layer, a second metal element provided in the diffusion barrier layer and at least one of a third metal provided in the silicide layer and Si element.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
a semiconductor substrate;
a silicide layer provided on the semiconductor substrate;
a dielectric layer provided on the semiconductor substrate;
a contact layer provided on the silicide layer;
a metal layer provided in the dielectric layer and electrically connected to the silicide layer via the contact layer;
a diffusion barrier layer provided between the dielectric layer and the metal layer,
wherein the contact layer includes a first metal element provided in the metal layer, a second metal element provided in the diffusion barrier layer and at least one of a third metal provided in the silicide layer and Si element, and
the contact layer is in contact with the metal layer.

2. A semiconductor device of claim 1, wherein the contact layer is in contact with the diffusion barrier layer.

3. A semiconductor device of claim 1, wherein the contact layer includes Cu, Mn and Ni, and
the first metal is Cu, the second metal is Mn, and the third metal is Ni.

4. A semiconductor device of claim 1, wherein the contact layer includes Cu, Zn and Ni, and
the first metal is Cu, the second metal is Zn, and the third metal is Ni.

5. A semiconductor device of claim 1, wherein the contact layer includes Al, V and Ti, and
the first metal is Al, the second metal is V, and the third metal is Ti.

6. A semiconductor device of claim 1, wherein the contact layer includes Al, V and Ti, and
the first metal is Al, the second metal is Mg, and the third metal is Si.

7. A semiconductor device of claim 1, wherein the diffusion barrier layer includes at least one of Mn, Zn, V, and Mg.

8. A semiconductor device of claim 1, wherein the metal layer includes at least one of Cu and Al.

9. A semiconductor device, comprising:
a semiconductor substrate;
a silicide layer provided on the semiconductor substrate;
a dielectric layer provided on the semiconductor substrate;
a contact layer provided on the silicide layer;
a metal layer provided in the dielectric layer and electrically connected to the silicide layer via the contact layer;
a diffusion barrier layer provided between the dielectric layer and the metal layer,
wherein the contact layer includes a first metal element provided in the metal layer, a second metal element provided in the diffusion barrier layer and at least one of a third metal provided in the silicide layer and Si element, and
the diffusion barrier layer is in contact with a side surface of the contact layer.

10. A semiconductor device of claim 9, wherein the contact layer is in contact with the diffusion barrier layer.

11. A semiconductor device of claim 9, wherein the contact layer includes Cu, Mn and Ni, and
the first metal is Cu, the second metal is Mn, and the third metal is Ni.

12. A semiconductor device of claim 9, wherein the contact layer includes Cu, Zn and Ni, and
the first metal is Cu, the second metal is Zn, and the third metal is Ni.

13. A semiconductor device of claim 9, wherein the contact layer includes Al, V and Ti, and
the first metal is Al, the second metal is V, and the third metal is Ti.

14. A semiconductor device of claim 9, wherein the contact layer includes Al, V and Ti, and
the first metal is Al, the second metal is Mg, and the third metal is Si.

15. A semiconductor device of claim 9, wherein the diffusion barrier layer includes at least one of Mn, Zn, V, and Mg.

16. A semiconductor device of claim 9, wherein the metal layer includes at least one of Cu and Al.

17. A semiconductor device, comprising:
a semiconductor substrate;
a silicide layer provided on the semiconductor substrate;
a dielectric layer provided on the semiconductor substrate;
a contact layer provided on the silicide layer;
a metal layer provided in the dielectric layer and electrically connected to the silicide layer via the contact layer;
a diffusion barrier layer provided between the dielectric layer and the metal layer,
wherein the contact layer includes a first metal element provided in the metal layer, a second metal element provided in the diffusion barrier layer and at least one of a third metal provided in the silicide layer and Si element, and
the diffusion barrier layer is in contact with a side surface of the contact layer, and the contact layer is in contact with the metal layer.

18. A semiconductor device of claim 17, wherein the contact layer is in contact with the diffusion barrier layer.

19. A semiconductor device of claim 17, wherein the contact layer includes Cu, Mn and Ni, and the first metal is Cu, the second metal is Mn, and the third metal is Ni.

20. A semiconductor device of claim 17, wherein the contact layer includes Cu, Zn and Ni, and
the first metal is Cu, the second metal is Zn, and the third metal is Ni.

21. A semiconductor device of claim 17, wherein the contact layer includes Al, V and Ti, and
the first metal is Al, the second metal is V, and the third metal is Ti.

22. A semiconductor device of claim 17, wherein the contact layer includes Al, V and Ti, and
the first metal is Al, the second metal is Mg, and the third metal is Si.

23. A semiconductor device of claim 17, wherein the diffusion barrier layer includes at least one of Mn, Zn, V, and Mg.

24. A semiconductor device of claim 17, wherein the metal layer includes at least one of Cu and Al.

* * * * *